(12) United States Patent
Miller et al.

(10) Patent No.: US 6,522,135 B2
(45) Date of Patent: *Feb. 18, 2003

(54) NUCLEAR QUADRUPOLE RESONANCE (NQR) METHOD AND PROBE FOR GENERATING RF MAGNETIC FIELDS IN DIFFERENT DIRECTIONS TO DISTINGUISH NQR FROM ACOUSTIC RINGING INDUCED IN A SAMPLE

(75) Inventors: Joel B. Miller, Cheverly, MD (US); Allen N. Garroway, Fort Washington, MD (US); Bryan Suits, Houghton, MI (US)

(73) Assignee: The United States of America as represented by the Secretary of the Navy, Washington, DC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/904,937

(22) Filed: Aug. 1, 1997

(65) Prior Publication Data

US 2002/0093335 A1 Jul. 18, 2002

(51) Int. Cl.[7] .................................................. G01V 3/00
(52) U.S. Cl. ....................................... 324/300; 324/315
(58) Field of Search .................................. 324/300, 307, 324/309, 315, 318, 322

(56) References Cited

U.S. PATENT DOCUMENTS

| | | | | | |
|---|---|---|---|---|---|
| 3,643,181 | A | * | 2/1972 | Stirrat et al. | 324/300 |
| 5,365,171 | A | * | 11/1994 | Buess et al. | 324/307 |
| 5,814,989 | A | * | 9/1998 | Smith et al. | 324/300 |

* cited by examiner

*Primary Examiner*—Louis Arana
(74) *Attorney, Agent, or Firm*—John J. Karasek; Lawrence G. Legg

(57) ABSTRACT

A nuclear quadrupole resonance (NQR) method and probe for generating RF magnetic fields in different directions to distinguish NQR from acoustic ringing induced in a sample. Generally, an RF magnetic field is generated along an axis towards a sample to induce a resonance signal in the sample. The resonance signal includes NQR and acoustic ringing. The resonance signal is detected along the RF magnetic field axis. The acoustic ringing is detected along a direction orthogonal to the RF magnetic field axis. As a result, the NQR in the resonance signal can be distinguished from the acoustic ringing in the resonance signal.

33 Claims, 8 Drawing Sheets

NUCLEAR QUADRUPOLE RESONANCE (NQR) METHOD AND PROBE FOR GENERATING RF MAGNETIC FIELDS IN DIFFERENT DIRECTIONS TO DISTINGUISH NQR FROM ACOUSTIC RINGING INDUCED IN A SAMPLE

BACKGROUND OF THE INVENTION

1. Field of the Invention

The present invention relates to a nuclear quadrupole resonance (NQR) method and probe for generating RF magnetic fields in different directions towards a sample. More specifically, the present invention relates to an NQR method and probe for generating RF magnetic fields in different directions to distinguish NQR from acoustic ringing induced in the sample.

2. Description of the Related Art

There are many situations where it is desirable to detect the presence of a target material (that is, a specific substance). For example, with the unfortunate increase in drug trafficking and terrorist use of high explosives in aircraft and buildings, detection systems are often used to detect sub-kilogram quantities of narcotics and explosives against a background of more benign materials. For example, such detection systems are typically used in airports to detect narcotics or explosives hidden in luggage.

Nuclear quadrupole resonance (NQR) is a known technique for detecting a target material. Generally, radio frequency (RF) radiation at a particular frequency will induce a free induction decay (FID) from nuclear spins in specific substances, but not in other substances. Nuclear quadrupole resonance (NQR) takes advantage of this phenomenon to detect one of these specific substances as a target material.

FIG. 1 is a diagram illustrating a conventional NQR apparatus. Referring now to FIG. 1, a transmitter 20 and a receiver 22 are connected to a probe 24 through a transmit/receive (T/R) switch 26. Probe 24 includes an inductor, such as a coil 28, forming part a resonant circuit with various other inductors L and capacitors C. To detect the presence of a target material, T/R switch 26 connects transmitter 20 to probe 24 while disconnecting receiver 22 from probe 24. Then, transmitter 20 generates a pulse and supplies the pulse to probe 24. Generally, the pulse is formed by an RF signal having a frequency corresponding to the resonance signal of the nuclei of the target material which is intended to be detected. Probe 24 receives the pulse, which causes coil 28 to store (RF) energy. If a sample (not illustrated) is appropriately placed near, or inside, coil 28, the stored RF energy will cause a corresponding RF magnetic field to irradiate the sample. If the sample includes the target material, the RF magnetic field will induce a nuclear quadrupole resonance (NQR) in the target material. The NQR signal is the free induction decay (FID) from nuclear spins in the target material that were excited by the RF magnetic field.

After the sample is irradiated with the RF magnetic field, T/R switch 26 connects receiver 22 to probe 24 while disconnecting transmitter 20 from probe 24. Coil 28 then detects the NQR induced in the target material, and probe 24 produces a corresponding output signal. The output signal of probe 24 is received and analyzed by receiver 22, to confirm the presence of the target material in the sample.

In real world use of NQR to detect narcotics and explosives, a sample may contain nearly any substance known to man, and may possibly include the explosive or narcotic to be detected. Because of the narrow bandwidth of an appropriate RF magnetic field irradiating the sample and the large range of NQR frequencies in benign materials, it is unlikely that an NQR signal will be induced in the other substances by the RF magnetic field. As a result, an NQR apparatus can accurately detect specific substances without producing false alarms (false positives).

However, the RF magnetic field can induce magnetostrictive ringing in a sample containing magnetic domains, due to a magnetostrictive effect. Similarly, the electric field component of the RF magnetic field can induce piezoelectric ringing in the sample. Magnetostrictive ringing and piezoelectric ringing can both be referred to as "acoustic ringing". Unfortunately, such acoustic ringing can be relatively large, and can produce false alarms in the detection of a target material.

The number of false alarms can be reduced by recognizing that acoustic ringing and NQR respond differently to an RF magnetic field. Therefore, acoustic ringing and NQR can be distinguished in many cases. However, the character of acoustic ringing often changes over time, requiring that acoustic ringing cancellation schemes be implemented on a short time scale. In addition, due to the time variation of acoustic ringing and the sometimes very large difference in amplitudes between acoustic ringing and NQR, it can be difficult to detect NQR.

SUMMARY OF THE INVENTION

Accordingly, it is an object of the present invention to provide an NQR apparatus and method which provide accurate detection of NQR, while reducing the likelihood of false alarms.

It is a further object of the present invention to provide an NQR apparatus and method which can separate NQR from acoustic ringing induced in a sample.

Additional objects and advantage of the invention will be set forth in part in the description which follows, and, in part, will be obvious from the description, or may learned by practice of the invention.

The foregoing objects of the present invention are achieved by providing a method which includes the steps of (a) generating an RF magnetic field in a first direction towards a sample; and (b) generating an RF magnetic field in a second direction towards the sample, wherein the second direction is not parallel to the first direction, and the RF magnetic fields are generated to detect NQR in the sample.

Objects of the present invention are further achieved by providing a method which includes the steps of (a) generating an RF magnetic field along an RF magnetic field axis towards a sample to cause a resonance signal in the sample, the resonance signal including NQR and acoustic ringing; (b) detecting the resonance signal along the RF magnetic field axis; and (c) detecting the acoustic ringing along a direction not parallel to the RF magnetic field axis, so that the NQR in the resonance signal can be distinguished from the acoustic ringing in the resonance signal.

Objects of the present invention are achieved by providing a probe which generates an RF magnetic field in a first direction and an RF magnetic field in a second direction towards a sample, to detect NQR in the sample. The first and second directions are not, parallel to each other, and are preferably orthogonal.

Objects of the present invention are also achieved by providing a probe which generates an RF magnetic field along an RF magnetic field axis towards a sample to cause a resonance signal in the sample. The resonance signal includes NQR and acoustic ringing. The probe detects the resonance signal along the RF magnetic field axis and detects the acoustic ringing along a direction not parallel to the RF magnetic field axis, so that the NQR in the resonance signal can be distinguished from the acoustic ringing in the resonance signal.

BRIEF DESCRIPTION OF THE DRAWINGS

These and other objects and advantages of the invention will become apparent and more readily appreciated from the following description of the preferred embodiments, taken in conjunction with the accompanying drawings which.

DESCRIPTION OF THE PREFERRED EMBODIMENTS

Figure 1:
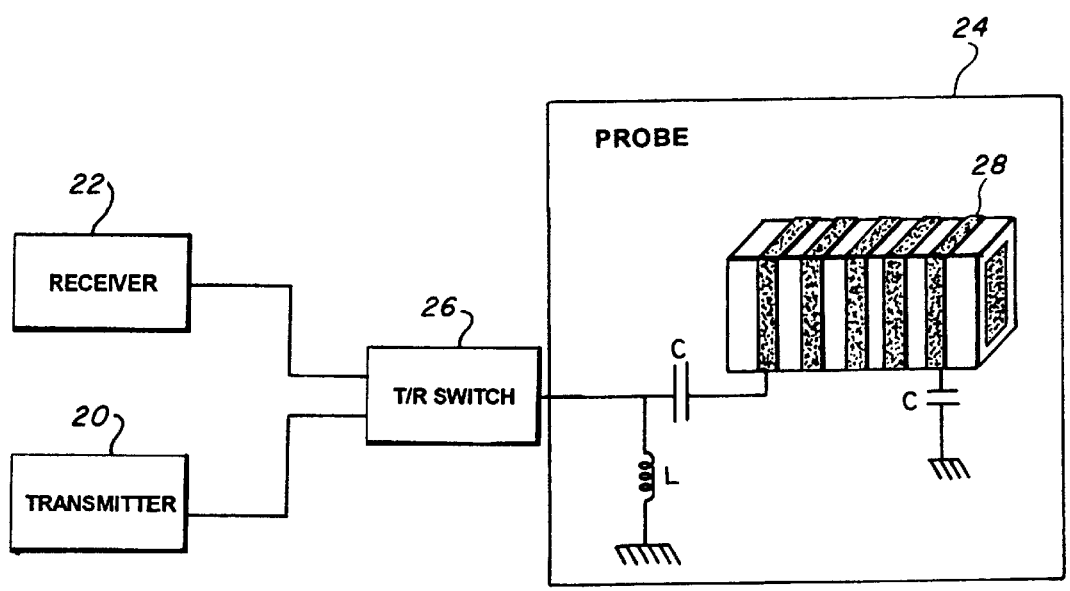
FIG. 1 (prior art) is a diagram illustrating a conventional NQR apparatus.

Reference will now be made in detail to the present preferred embodiments of the present invention, examples of which are illustrated in the accompanying drawings, wherein like reference numerals refer to like elements throughout.

Referring again to FIG. 1, coil 28 irradiates a sample with an RF magnetic field to induce NQR in the sample. The direction of the RF magnetic field with respect to the sample is determined by the geometry of coil 28 and the position of the sample in or near coil 28. For the typical case of a powdered or polycrystalline sample, an RF magnetic field generated along an RF magnetic field axis will induce NQR regardless of the direction of the RF magnetic field. However, generally, the induced NQR is only detectable along the RF magnetic field axis.

Moreover, magnetostrictive ringing depends on the orientation of the RF magnetic field with respect to the magnetic fields of the magnetic domains within the sample. Further, a variation in magnetostrictive ringing strength with sample orientation has been experimentally observed by the inventors of the present invention. Thus, magnetostrictive ringing may be reduced and distinguished from induced NQR by making NQR measurements with the sample at several different orientations with respect to the RF magnetic field.

Figure 2:
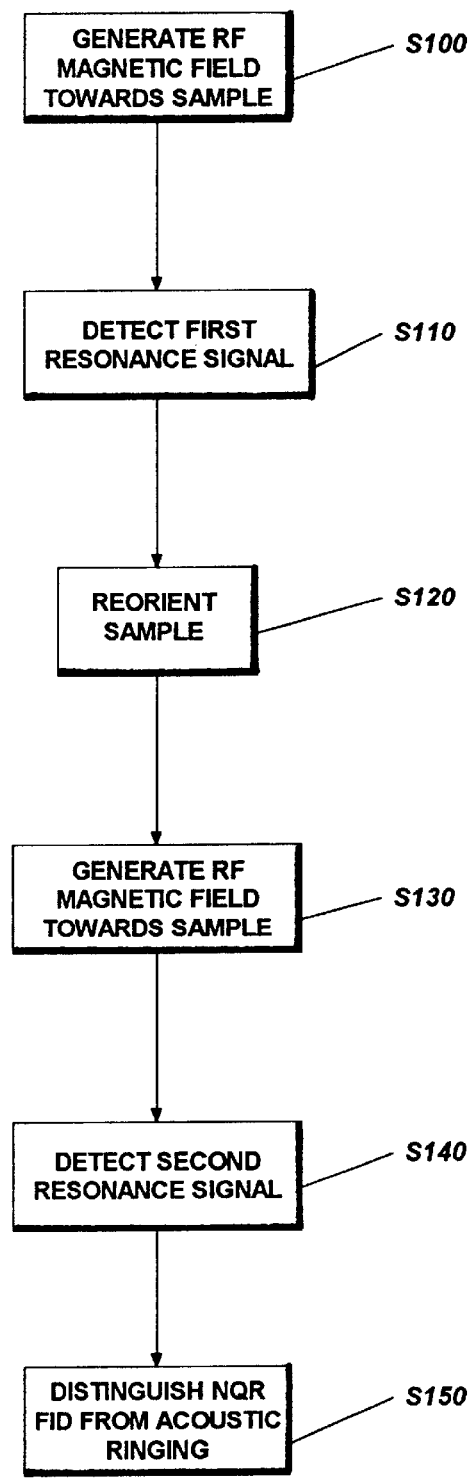
FIG. 2 is a flowchart illustrating a method for detecting NQR, according to an embodiment of the present invention.

For example, FIG. 2 is a flowchart illustrating a method for detecting NQR, according to an embodiment of the present invention. Referring now to FIG. 2, the process starts in step S100, where an RF magnetic field is generated towards a sample along an RF magnetic field axis to induce a first resonance signal in the sample. The first resonance signal will likely include both NQR and acoustic ringing. From step S100, the process moves to step S110, where the first resonance signal is detected.

From step S110, the process moves to step S120, where the sample is reoriented with respect to the RF magnetic field axis. Then, the process moves to step S130, where an RF magnetic field is generated towards a sample along the RF magnetic field axis to induce a second resonance signal in the sample. The second resonance signal will likely include both NQR and acoustic ringing. From step S130, the process moves to step S140, where the second resonance signal is detected.

From step S140, the process moves to step S150, where the detected first and second resonance signals are analyzed to distinguish NQR from acoustic ringing occurring in the sample. Such analysis is easily determinable by a person of skill in the art.

While the method disclosed in FIG. 2 is effective, it is time consuming to reorient a sample. For example, a sample, such as an airline bag, must be manually rerun in another orientation through a coil, to thereby distinguish NQR from acoustic ringing. Such extra manual handling can seriously slow down the throughput of the overall system.

Figure 3:
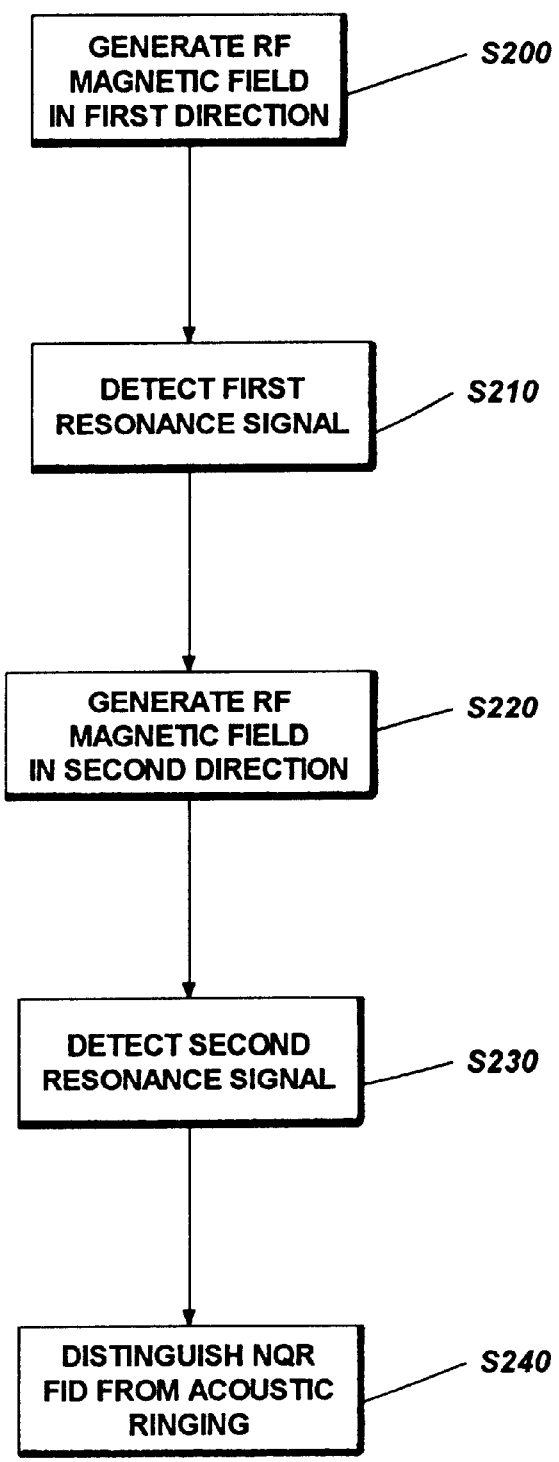
FIG. 3 is a flowchart illustrating a method for detecting NQR, according to an embodiment of the present invention.

Therefore, instead of reorienting the sample, a preferred alternative is to reorient the RF magnetic field. For example, FIG. 3 is a flowchart illustrating a method for detecting NQR, according to an additional embodiment of the present invention. Referring now to FIG. 3, the process starts in step S200 where an RF magnetic field is generated in a first direction towards a sample, to induce a first resonance signal in the sample. The first resonance signal typically includes NQR and acoustic ringing. From step S200, the process moves to step S210 where the first resonance signal is detected.

From step S210, the process moves to step S220, where an RF magnetic field is generated in a second direction towards the sample, to induce a second resonance signal in the sample. The first direction is not parallel to the second direction, and is preferably orthogonal to the second direction. Moreover, the second resonance signal typically includes NQR and acoustic ringing. From step S220, the process moves to step S230, where the second resonance signal is detected.

From step S230, the process moves to step S240 where the detected first and second resonance signals are analyzed to distinguish NQR from acoustic ringing occurring in the sample. Such analysis is easily determinable by a person of skill in the art.

The method illustrated in FIG. 3 could be accomplished using a probe which includes several RF coils to generate RF magnetic fields in different directions and to detect resonance signals in different directions. However, the increased cost and difficulties with sample loading are undesirable. A better solution is discussed below.

Generally, magnetic or piezoelectric domains causing acoustic ringing will not be perfectly aligned along the RF magnetic field axis of an RF magnetic field irradiating a sample, nor will they exhibit spatial statistical averaging as the NQR. Therefore, the acoustic ringing can be detected in a first RF coil which is not parallel, and is preferably orthogonal, to the RF magnetic field axis. By contrast, for powder specimens, generally, NQR may only be detected along the RF magnetic field axis. Therefore, a second coil can be used to detect signals along the RF magnetic field axis. As a result, one coil will respond to both NQR and acoustic ringing. The other coil will respond to only acoustic ringing. The acoustic ringing can then be differentiated from the NQR signal. This approach should substantially reduce false alarm rates and also allow observation of NQR of explosives or contraband that might otherwise be masked by acoustic ringing.

Figure 4:
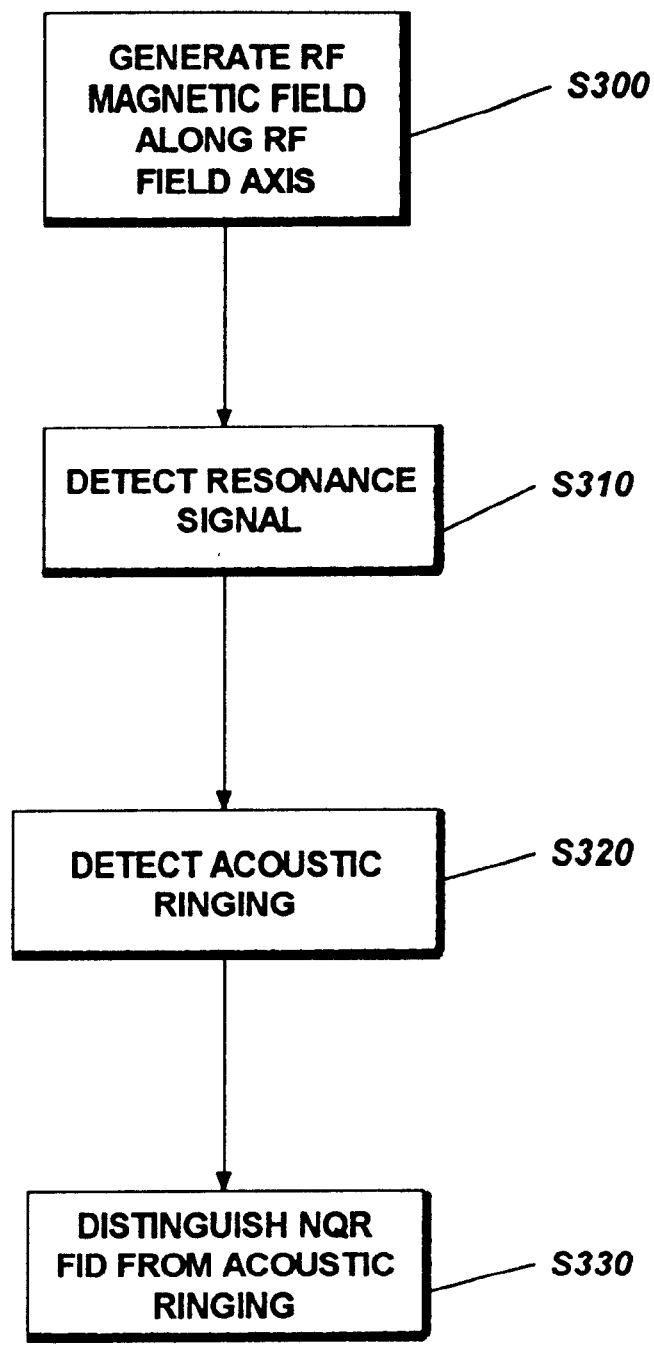
FIG. 4 is a flowchart illustrating a method for detecting NQR, according to an additional embodiment of the present invention.

Therefore, FIG. 4 is a flowchart illustrating a method for detecting NQR, according to an additional embodiment of the present invention. Referring now to FIG. 4, the process starts in step S300, where an RF magnetic field is generated along an RF magnetic field axis towards a sample to cause a resonance signal in the sample. The resonance signal typically includes NQR and acoustic ringing.

From step S300, the process moves to step S310, where the resonance signal is detected along the RF magnetic field axis. From step S310, the process moves to step S320, where the acoustic ringing is detected along a direction not parallel to, and preferably orthogonal to, the RF magnetic field axis. From step S320, the process moves to step S330, where NQR is distinguished from acoustic ringing in the resonance signal.

The apparatus illustrated in FIG. 1 can be used to implement the processes illustrated in FIGS. 2, 3 and 4. For example, to generate an RF magnetic field towards a sample in any of these processes, T/R switch 26 (see FIG. 1) connects transmitter 20 (see FIG. 1) to probe 24 (see FIG. 1) while disconnecting receiver 22 (see FIG. 1) from probe 24. By contrast, to detect a resonance signal, T/R switch 26 connects receiver 22 to probe 24 while disconnecting transmitter 20 from probe. In addition, the processes illustrated in FIGS. 2, 3 and 4 are not intended to be limited to implementation by the precise apparatus illustrated in FIG. 1. For example, instead of using a T/R switch, a transmitter can have its own dedicated antenna for generating an RF magnetic field, and a receiver can have its own dedicated antenna for receiving a resonance signal. Many other apparatus configurations can be used to implement the processes illustrated in FIGS. 2, 3 and 4.

Therefore, in various embodiments of the present invention as described above, an RF magnetic field is generated in different directions and/or various signals are detected in different directions. Several different coils can be used to generate RF magnetic fields in different directions and/or to detect signals in different directions. For example, a first coil can be used to generate an RF magnetic field in a first direction and to detect resonance signals in the first direction, and a second coil can be used to generate an RF magnetic field in a second direction and to detect resonance signals in the second direction. However, the use of separate coils requires the coils to be properly aligned, matched and tuned. Such alignment, matching and tuning can be difficult to achieve. Therefore, it is preferable to use a single coil which can generate and detect signals in different directions. The coil should be able to generate and detect signals in at least two directions which are not parallel to each other. Preferably, the coil can generate and detect signals in three directions which are orthogonal to each other. Moreover, it is preferable to use a coil which allows the RF magnetic field direction within the coil to be electrically altered. A conventional "birdcage" coil is a coil which will satisfactorily generate and detect signals in at least two directions, and which will allow the RF magnetic field direction to be electrically altered.

Figure 5:
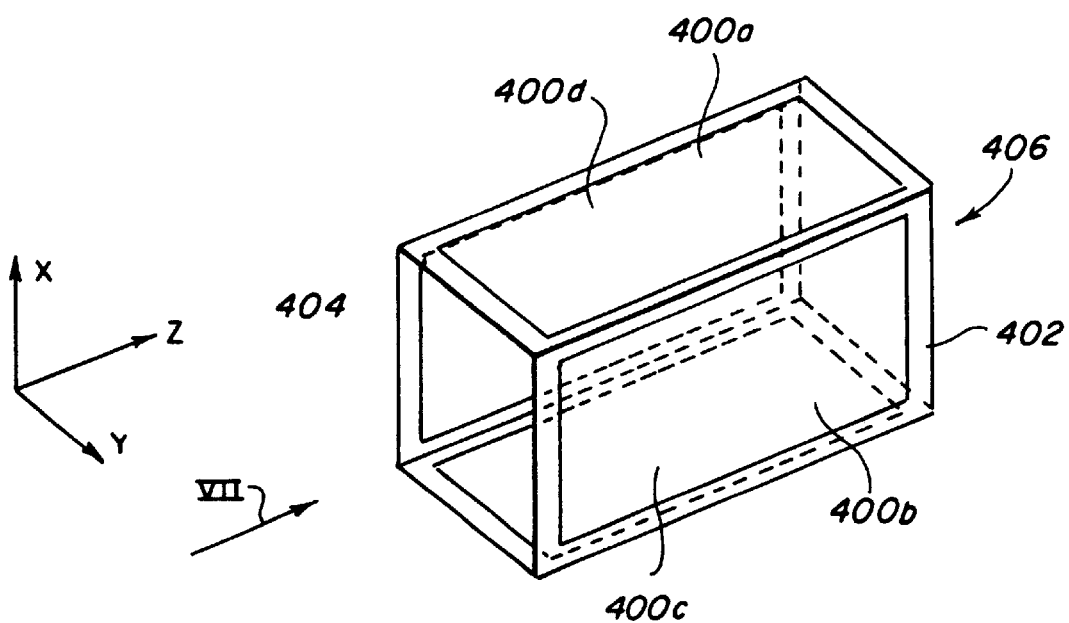
FIG. 5 is a diagram illustrating a type of coil which will generate RF magnetic fields in three orthogonal directions, according to an embodiment of the present invention.

FIG. 5 is a diagram illustrating a novel coil which will generate RF magnetic fields in three orthogonal directions, according to an embodiment of the present invention. Referring now to FIG. 5, the coil includes four electrically conducting surfaces 400a, 400b, 400c and 400d arranged as four faces of a rectangle or cube. Conducting surfaces 400a and 400c are opposite to each other and in parallel. Similarly, conducting surfaces 400b and 400d are opposite to each other and in parallel. Preferably, conducting surfaces 400a, 400b, 400c and 400d are supported by a coil former 402 so that gaps exist between the conducting sheets to allow magnetic flux lines to pass between the conducting sheets. The coil has end faces 404 and 406 which are preferably not covered so as to allow passage of a sample, such as a suitcase, into the coil. FIG. 5 indicates arbitrary X, Y and Z axes which are orthogonal to each other, and which represent the RF magnetic field axes of generated RF magnetic fields. Moreover, the coil can be tuned and matched in a conventional manner.

FIGS. 6(A), 6(B), 6(C) and 6(D) are diagrams illustrating the current flow through conducting surfaces 400a, 400b, 400c and 400d to generate RF magnetic fields in various directions.

Figure 6A:
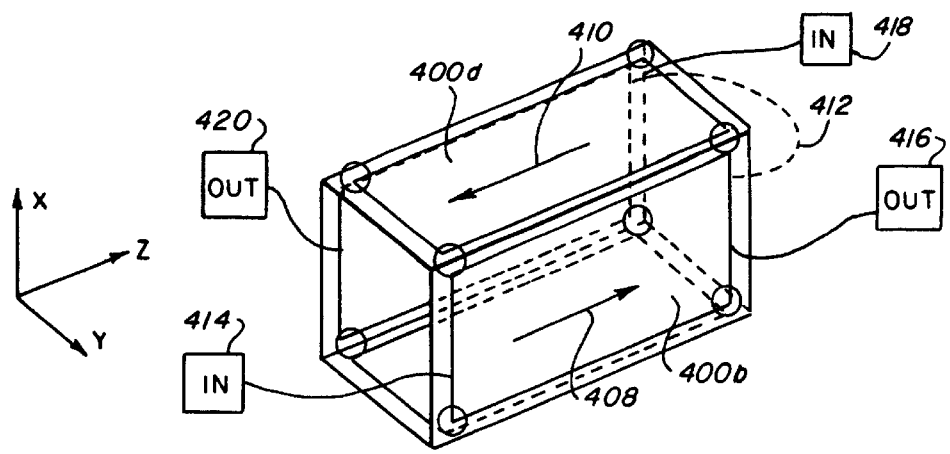
FIG. 6(A) is a diagram illustrating the current flow in the coil of FIG. 5 to generate an RF magnetic field along the X axis, according to an embodiment of the present invention.

More specifically, FIG. 6(A) is a diagram illustrating the current flow in the coil to generate an RF magnetic field along the X axis, according to an embodiment of the present invention. Referring now to FIG. 6(A), an RF magnetic field is generated along the X axis by supplying a current +I along the Z direction from one end of conducting sheet 400b to the opposite end of conducting sheet 400b. Then, the opposite current −I travels along the Z direction from one end of conducting sheet 400d to the opposite end of conducting sheet 400d. Therefore, the current travels in the direction of arrow 408 through conducting sheet 400b and then travels in the direction of arrow 410 of conducting sheet 400d.

To provide the necessary current flow, a connection can be made between conducting sheets 400b and 400d, as indicated by dotted connection 412 in FIG. 6 (A). Therefore, current flows through conducting sheet 400b, through connection 412, and then through conducting sheet 400d. Such a connection 412 can easily be made, for example, by connecting various switches to conducting sheets 400b and 400d.

Alternatively, referring to FIG. 6(A), to provide the necessary current flow, a current source 414 can be provided at one end of conducting sheet 400b. The current would then flow through conducting sheet 400b to an output 416. After the current flows through conducting sheet 400b, a current would then travel from a current source 418, through conducting sheet 400d, to an output 420. However, the present invention is not intended to be limited to controlling the current with connection 412, or current sources 414 and 418.

Instead, there are many different methods which can be used to provide the proper current flow through conducting sheets 400b and 400d. Moreover, the current is not intended to be limited to flow through conducting sheet 400b and then through conducting sheet 400d. Instead, for example, the current can flow through conducting sheet 400d and then through conducting sheet 400b.

Figure 6B:
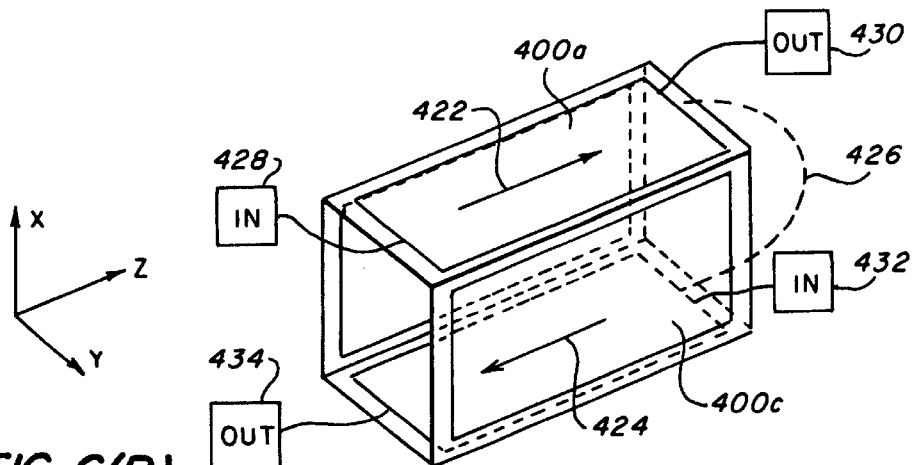
FIG. 6(B) is a diagram illustrating the current flow in the coil of FIG. 5 to generate an RF magnetic field along the Y axis, according to an embodiment of the present invention.

FIG. 6(B) is a diagram illustrating the current flow in the coil to generate an RF magnetic field along the Y axis, according to an embodiment of the present invention. Referring now to FIG. 6(B), an RF magnetic field is generated along the Y axis by supplying a current +I along the Z direction from one end of conducting sheet 400a to the opposite end of conducting sheet 400a. Then, the opposite current −I travels along the Z direction from m-o one end of conducting sheet 400c to the opposite end of conducting sheet 400c. Therefore, the current travels in the direction of arrow 422 through conducting sheet 400a and then travels in the direction of arrow 424 of conducting sheet 400c.

To provide the necessary current flow, a connection can be made between conducting sheets 400a and 400c, as indicated by dotted connection 426 in FIG. 6(B). Therefore, current flows through conducting sheet 400a, through connection 426, and then through conducting sheet 400c. Such a connection 426 can easily be made, for example, by connecting various switches to conducting sheets 400a and 400c.

Alternatively, referring to FIG. 6(B), to provide the necessary current flow, a current source 428 can be provided at one end of conducting sheet 400a. The current would then flow through conducting sheet 400a to an output 430. After the current flows through conducting sheet 400a, a current would then travel from a current source 432, through conducting sheet 400c, to an output 434. However, the present invention is not intended to be limited to controlling the current with connection 426, or current sources 428 and 432. Instead, there are many different methods which can be used to provide the proper current flow through conducting sheets 400a and 400c. Moreover, the current is not intended to be limited to flow through conducting sheet 400a and then through conducting sheet 400c. Instead, for example, the current can flow through conducting sheet 400c and then through conducting sheet 400a.

Figure 6C:
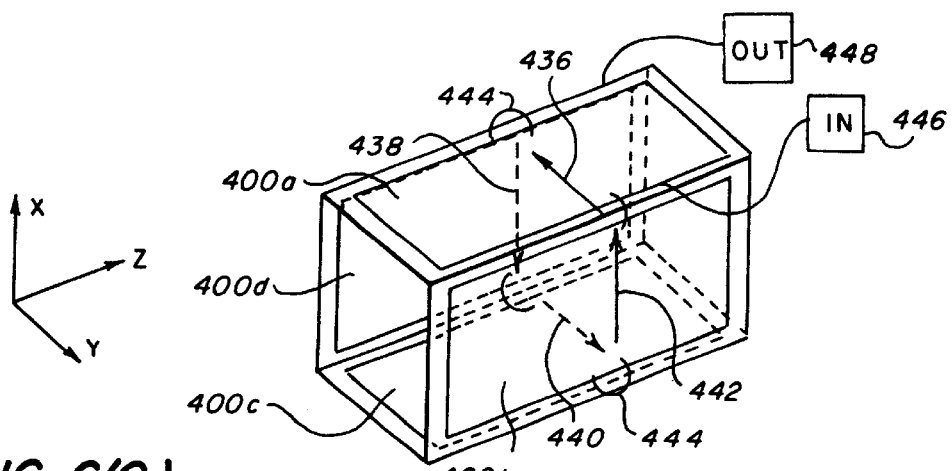
FIG. 6(C) is a diagram illustrating the current flow in the coil of FIG. 5 to generate an RF magnetic field along the Z axis, according to an embodiment of the present invention.

FIG. 6(C) is a diagram illustrating the current flow in the coil to generate an RF magnetic field along the Z axis, according to an embodiment of the present invention. Referring now to FIG. 6(C), an RF magnetic field is generated along the Z axis by circulating current serially through the conducting sheets. For example, current flows through conducting sheet 400a in the direction of arrow 436, then through conducting sheet 400d in the direction.of arrow 438, then through conducting sheet 400c in the direction of arrow 440, and finally through conducting sheet 400b in the direction of arrow 442. Therefore, to generate an RF magnetic field along the Z axis, the current is controlled to flow in the X direction, the Y direction, the −X direction and the −Y direction.

To provide the necessary current flow, electrical connections 444 can be made between the various conducting sheets. Alternatively, to provide the necessary current flow, current sources and outputs can be provided for each conducting sheet. For example, FIG. 6(C) illustrates a current source 446 to provide current to conducting sheet 400a, and an output 448 to receive the current. Although not shown in FIG. 6(C), similar current sources and outputs could be provided for each of the other conducting sheets, and the various current sources could easily be controlled to provide the proper current flow.

Moreover, although FIG. 6(C) indicates that current starts in conducting sheet 400a and serially flows through each of the other conducting sheets, it is not intended for the current to be limited to being started in any particular conducting sheet.

Electrical connections to connect conducting sheets 400a, 400b, 400c and 400d, to generate three RF magnetic fields, are not intended to be limited to the specific examples disclosed herein. Instead, many different mechanisms can be employed to provide appropriate electrical switching and which are easily determinable by persons skilled in the art. In addition, currents may flow simultaneously through both pairs of parallel conducting sheets to generate magnetic fields pointing in arbitrary directions.

With the coil illustrated in FIG. 5, RF detection in the X and Y directions can occur simultaneously. Therefore, the coil can be used to differentiate acoustic ringing from a resonance signal. In addition, an RF magnetic field can easily be switched among three orthogonal directions to reduce the effects of acoustic ringing. Hence, this type of coil can be used to generate and detect signals in various embodiments of the present invention, to reduce acoustic ringing and improve the detectability of materials of interest. Also, the use of the coil illustrated in FIG. 5 can reduce false alarms in NQR detection of explosives and contraband by minimizing the effects of acoustic ringing. The coil may also prove useful in minimizing RF shielding effects.

Moreover, by allowing the generation of RF magnetic fields in three orthogonal directions, the coil provides access to all three spatial dimensions. This is important for minimizing the effect of magnetostrictive and piezoelectric ringing from a randomly oriented object. Further, the coil would allow for electronic switching between RF magnetic fields, thereby saving measurement time, which is important for high sample-throughput applications. Moreover, the coil would allow for simultaneous detection along two or more orthogonal axes, thereby differentiating acoustic ringing from the NQR signal.

Figure 7:
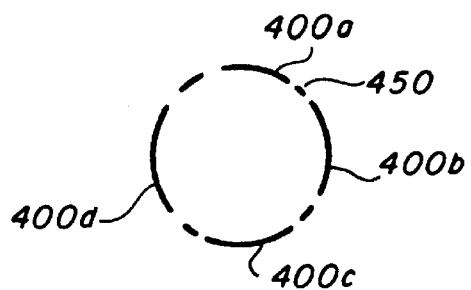
FIG. 7 is a diagram illustrating a coil as illustrated as in FIG. 5, but having a cylindrical shape when viewed in the direction VII illustrated in FIG. 5, according to an embodiment of the present invention.

The coil illustrated in FIG. 5 is described as being rectangular or square shaped. However, the coil can be, for example, cylindrical shaped. More specifically, FIG. 7 is a diagram illustrating a coil as illustrated as in FIG. 5, but having a cylindrical shape when viewed in the direction VII illustrated in FIG. 5, according to an embodiment of the present invention. Therefore, the conducting sheets 400a, 400b, 400c and 400c can be, for example, wrapped around a cylinder 450 to form a cylindrical shape.

Therefore, generally, in the above embodiments of the present invention, an RF magnetic field is generated to irradiate a sample. Typically, the RF magnetic field is linearly polarized and is applied to a sample (typically a "powder") at the appropriate NQR resonance frequency, $|\omega_0|$. The RF magnetic field will induce NQR which will typically be linearly polarized with a polarization axis parallel to the RF magnetic field axis. Magnetostrictive ringing induced by the linearly polarized RF magnetic field will also typically be linearly polarized, but the polarization axis of the magnetostrictive ringing may be in any direction. The RF magnetic field axis has a non-zero projection on the ringing polarization axis.

However, the RF magnetic field is not intended to be limited to being linearly polarized. For example, the linearly polarized NQR signal excited by a linearly polarized RF magnetic field results from crystallites in a powdered sample with positive or negative projections of their quantization axes on the RF magnetic field axis. A probe which can produce RF magnetic fields in two orthogonal directions can apply circularly polarized RF magnetic fields at $+\omega_0$ or $-\omega_0$ by exciting the probe in one direction as $\cos(w_0 t)$ and in an orthogonal direction as $\pm\sin(\omega_0 t)$. The RF magnetic field axis rotates about a third direction orthogonal to the two directions along which the probe is excited. The obtained NQR signal will be circularly polarized at $\pm\omega_0$, resulting from crystallites in the powdered sample with positive or negative projections of their quantization axes orthogonal to the RF magnetic field rotation axis. We find that the larger number of crystallites excited with a circularly polarized RF magnetic field will result in an approximate 22% improvement in the signal-to-noise ratio (SNR). The magnetostrictive ringing response to a circularly polarized RF magnetic field will, in general, not be circularly polarized. Instead, the polarization axis of the magnetostrictive ringing may be in any direction. The ringing. polarization axis has a finite projection on the RF magnetic field axis. Therefore, according to embodiments of the present invention, the difference between circularly polarized signals and non-circularly polarized signals provides another mechanism for distinguishing NQR from magnetostrictive ringing to improve detection of contraband materials.

Figure 8:
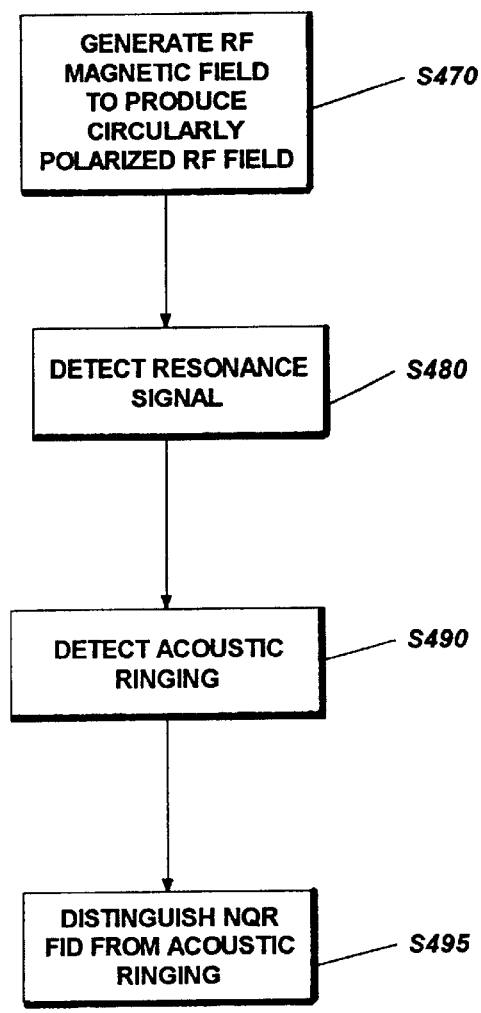
FIG. 8 is a flowchart illustrating a method for detecting NQR by generating a circularly polarized RF magnetic field, according to an embodiment of the present invention.

Therefore, for example, FIG. 8 is a flowchart illustrating a method for detecting NQR by generating a circularly polarized RF magnetic field, according to an embodiment of the present invention. Referring now to FIG. 8, in step S470, RF magnetic fields in first and second directions are simultaneously generated towards a sample to produce a resulting RF magnetic field which is circularly polarized and has a corresponding polarization axis. The resulting RF magnetic field, will cause a resonance signal to occur in the sample. Moreover, the resonance signal will typically include NQR and acoustic ringing.

From step S470, the process moves to step S480, where the resonance signal is detected along the two directions parallel to which the probe was excited.

From step S480, the process moves to step S490, where the acoustic ringing is detected along a direction not parallel, and preferably orthogonal, to the polarization axis of the resulting RF magnetic field.

From step S490, the process moves to step S495, where the NQR in the resonance signal is distinguished from the acoustic ringing, based on the signals detected in steps S480 and S490.

In addition to the coil illustrated in FIG. 5, for detection in three orthogonal directions, a cubic bandpass birdcage coil can be used to generate an RF magnetic field in two or three orthogonal directions, and to generate a circularly polarized RF magnetic field.

Figure 9:
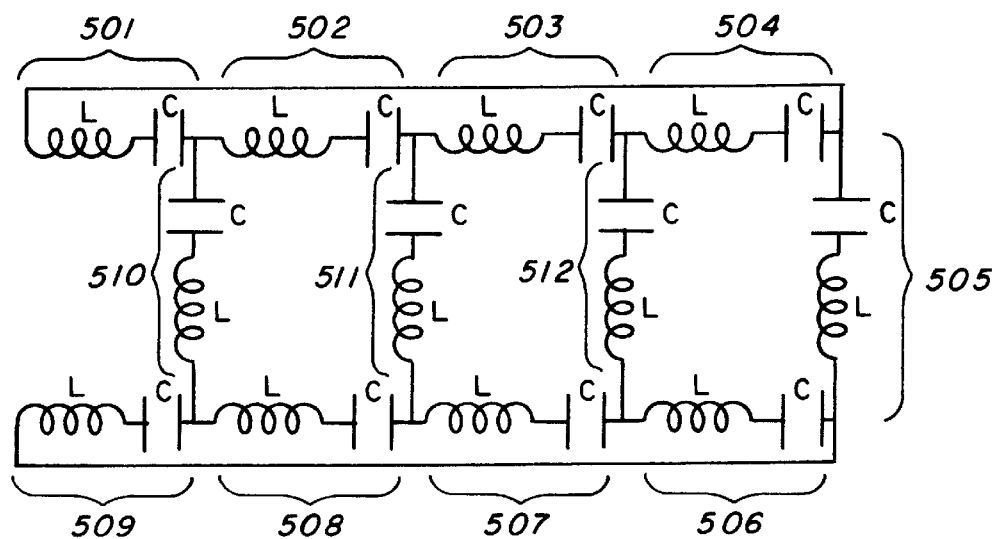
FIG. 9 is a diagram illustrating an electrical schematic of a coil which will generate RF magnetic fields in three orthogonal directions, according to an additional embodiment of the present invention.
Figure 10:
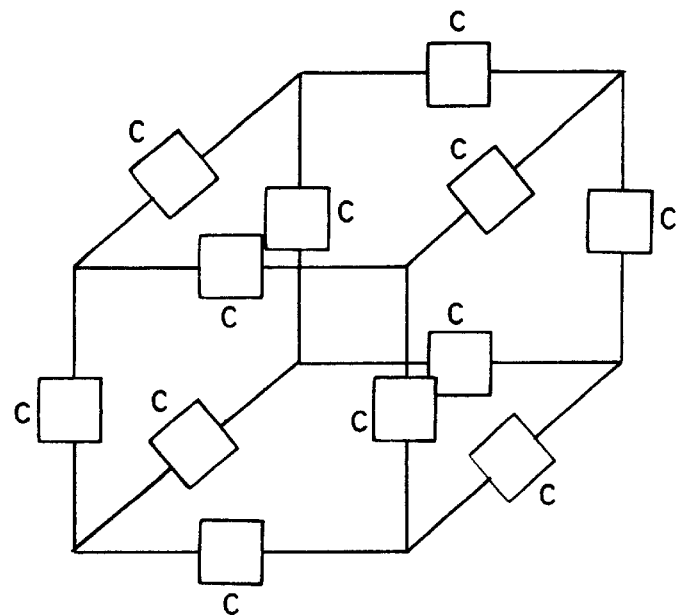
FIG. 10 is a diagram illustrating a component layout of the coil illustrated in FIG. 9, according to an embodiment of the present invention.

More specifically, FIG. 9 is a diagram illustrating an electrical schematic of a coil which will generate RF magnetic fields in three orthogonal directions, according to an embodiment of the present invention, and FIG. 10 is a diagram illustrating a component layout of the coil illustrated in FIG. 9, according to an embodiment of the present invention.

Referring now to FIGS. 9 and 10, the coil is constructed of twelve (12) elements 501 through 512, each along the edge of a cube, and connected at the corners. Elements 501 through 512 each include a capacitor C and an inductor L connected in series. The inductor is preferably a straight conductor, such as a wire.

With a bandpass birdcage coil having cubic symmetry, as illustrated in FIGS. 9 and 10, there are three spatially equivalent modes which produce magnetic fields in three orthogonal directions. Each of these modes can be driven in quadrature to produce circularly polarized RF magnetic fields. Moreover, the resonance frequency of the coil can, be calculated from standard birdcage coil equations. Driving the coil and the calculation of the resonance frequency of the coil is easily determinable by a person of skill in the art.

Therefore, as illustrated in FIGS. 9 and 10, a coil of a probe includes twelve elements connected together to form a cube. Each element is an edge of the cube and is formed of a capacitor and an inductor in series. The elements are provided with current which is controllable to cause the probe to generate an RF magnetic field in first, second and third directions which are preferably orthogonal to each other.

According to the above embodiments of the present invention, a birdcage coil is used to generate and/or detect signals in two or three directions, and thereby detect NQR in a sample and distinguish the detected NQR from acoustic ringing.

Orthogonal RF coils or birdcage-like coils do not appear to have been conventionally used in NQR. Such coils, or coils that generate and detect in two or more directions, have not been conventionally used in NQR because conventional NQR techniques only detect NQR. More specifically, conventional NQR techniques irradiate a sample with a linearly polarized RF magnetic field. As a result, the induced NQR is generally only detectable along the RF magnetic field axis. Therefore, conventional NQR techniques only detect along the RF magnetic field axis. Conventional NQR techniques do not attempt to separately detect acoustic ringing along an axis which is orthogonal, or not parallel, to the RF magnetic field axis.

Birdcage coils have been conventionally used in nuclear magnetic resonance (NMR) and magnetic resonance imaging (MRI) More specifically, regarding NMR and MRI, it is known that birdcage coils could be used for detection in two orthogonal directions, typically to increase detection sensitivity and RF magnetic field strength. Crossed coils have also been conventionally used in NMR and MRI. However, the underlying principles of NMR and MRI are significantly different than that of NQR. With conventional NMR and MRI, only two orthogonal RF magnetic fields are generated. More specifically, in NMR, the symmetry axis is along a static magnetic field. As a result, a third orthogonal axis has not been of interest. The coil in FIGS. 9 and 10 differs fundamentally from conventional MRI birdcage coils in that three orthogonal directions can be excited, rather than two as in conventional MRI coils.

NQR detection systems for the detection of explosives and narcotics, and various NQR concepts, are disclosed, for example, in U.S. patent titled "DETECTION OF EXPLOSIVE AND NARCOTICS BY LOW POWER LARGE SAMPLE VOLUME NUCLEAR QUADRUPOLE RESONANCE (NQR)", U.S. Pat. No. 5,233,300; U.S. patent titled "REMOVING THE EFFECTS OF ACOUSTIC RINGING AND REDUCING TEMPERATURE EFFECTS IN THE DETECTION OF EXPLOSIVES BY NQR", U.S. Pat. No. 5,365,171; and U.S. patent titled "DETECTION OF EXPLOSIVES BY NUCLEAR QUADRUPOLE RESONANCE", U.S. Pat. No. 5,206,592, which are incorporated herein by reference.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method comprising the steps of:
   generating an RF magnetic field in a first direction towards a sample; and
   generating an RF magnetic field in a second direction towards the sample, wherein the second direction is not parallel to the first direction, and the RF magnetic fields are generated to detect nuclear quadrupole resonance (NQR) in the sample, whereby both said first and second RF magnetic field directions are used for both excitation and detection, and whereby acoustic ringing is seperated from NQR detected in the sample.

2. A method as in claim 1, further comprising the step of:
   generating an RF magnetic field in a third direction towards the sample, to detect NQR in the sample, wherein the first, second and third directions are not parallel to each other.

3. A method as in claim 1, wherein the first and second directions are orthogonal to each other.

4. A method as in claim 2, wherein the first, second and third directions are orthogonal to each other.

5. A method as in claim 1, wherein the RF magnetic field generated in the first direction causes a first resonance signal to occur in the sample and the RF magnetic field generated in the second direction causes a second resonance signal to occur in the sample, the first and second resonance signals each including NQR and acoustic ringing, the method further comprising the step of:
   detecting the first and second resonance signals, to distinguish NQR occurring in the sample from acoustic ringing occurring in the sample.

6. A method as in claim 5, wherein the step of detecting the first and second resonance signals comprises the steps of:
   detecting the first resonance signal along the first direction; and
   detecting the second resonance signal along the second direction.

7. A method as in claim 1, wherein the RF magnetic field in the first direction and the RF magnetic field in the second direction are simultaneously generated towards the sample to produce a resulting RF magnetic field which is circularly polarized.

8. A method as in claim 1, wherein the RF magnetic field in the first direction and the RF magnetic field in the second direction are simultaneously generated towards the sample to produce a resulting RF magnetic field which is circularly polarized and has a corresponding polarization axis, the resulting RF magnetic field causing a resonance signal to occur in the sample, the resonance signal including circularly polarized NQR and non-circularly polarized acoustic ringing, and the method further comprising the steps of:
   detecting the NQR and acoustic ringing along the first and second directions; and
   distinguishing the NQR from the acoustic ringing.

9. A method comprising the steps of:
   generating an RF magnetic field along an RF magnetic field axis towards a sample to cause a resonance signal in the sample, the resonance signal including nuclear quadrupole resonance (NQR) and acoustic ringing;
   detecting the resonance signal along the RF magnetic field axis; and
   detecting the acoustic ringing along a direction not parallel to the RF magnetic field axis, so that the NQR in the resonance signal can be distinguished from the acoustic ringing in the resonance signal.

10. A method as in claim 9, wherein the direction not parallel to the RF magnetic field axis is orthogonal to the RF magnetic field axis.

11. A probe which generates an RF magnetic field in a first direction and an RF magnetic field in a second direction towards a sample, to detect nuclear quadrupole resonance (NQR) in the sample, the first and second directions being not parallel to each other, and wherein when no direct magnetic field is applied to the sample, linear polarization excitement of a targeted material produces a linearly polarized signal.

12. A probe as in claim 11, wherein the probe generates an RF magnetic field in a third direction towards the sample, the first, second and third directions being not parallel to each other.

13. A probe as in claim 11, wherein the first and second directions are orthogonal to each other.

14. A probe as in claim 12, wherein the first, second and third directions are orthogonal to each other.

15. A probe as in claim 11, wherein the probe is a birdcage coil.

16. A probe as in claim 12, wherein the probe is a birdcage coil.

17. A probe as in claim 11, wherein the RF magnetic field generated in the first direction and the RF magnetic field generated in the second direction are simultaneously generated by the probe towards the sample to produce a resulting RF magnetic field which is circularly polarized.

18. A probe as in claim 11, wherein
   the RF magnetic field generated in the first direction and the RF magnetic field generated in the second direction are simultaneously generated by the probe towards the sample to produce a resulting RF magnetic field which is circularly polarized and has a corresponding polarization axis, the resulting RF magnetic field causing a resonance signal to occur in the sample, the resonance signal including circularly polarized NQR and non-circularly polarized acoustic ringing, and
   the probe detects the NQR and acoustic ringing along the first and second directions so that the NQR can be distinguished from the acoustic ringing.

19. A probe as in claim 11, wherein
   the RF magnetic field generated in the first direction causes a first resonance signal to occur in the sample and the RF magnetic field generated in the second direction causes a second resonance signal to occur in the sample, the first and second resonance signals each including NQR and acoustic ringing, and
   the probe detects the first and second resonance signals, to distinguish NQR occurring in the sample from acoustic ringing occurring in the sample.

20. A probe as in claim 19, wherein the probe detects the first and second resonance signals along the first and second directions, respectively.

21. A probe as in claim 11, further comprising first, second, third and fourth conducting surfaces, wherein
   the first and second conducting surfaces are opposite to each other and in parallel,
   the third and fourth conducting surfaces are opposite to each other and in parallel, and
   the first, second, third and fourth conducting surfaces together form a square shape, a rectangular shape or a cylindrical shape.

22. A probe as in claim 21, wherein current travels through the first and second conducting surfaces, without travelling through the third and fourth conducted surfaces, to generate an RF magnetic field in the first direction, and current travels through the third and fourth conducting surfaces, without travelling through the first and second conducted surfaces, to generate an RF magnetic field in the second direction.

23. A probe as in claim 21, wherein a current travels through the first conducting surface and thereafter through the second conducting surface, without travelling through the third and fourth conducted surfaces, to generate an RF magnetic field in the first direction, and a current travels through the third conducting surface and thereafter through the fourth conducting surface, without travelling through the first and second conducted surfaces, to generate an RF magnetic field in the second direction.

24. A probe as in claim 21, wherein current travels through the first, second, third and fourth conducting surfaces to generate an RF magnetic field in an arbitrary and predetermined direction.

25. A probe as in claim 12, further comprising first, second, third and fourth conducting surfaces, wherein the first and second conducting surfaces are opposite to each other and in parallel, the third and fourth conducting surfaces are opposite to each other and in parallel, and the first, second, third and fourth conducting surfaces together form a square shape, a rectangular shape or a cylindrical shape.

26. A probe as in claim 25, wherein current travels through the first and second conducting surfaces, without travelling through the third and fourth conducted surfaces, to generate an RF magnetic field in the first direction, current travels through the third and fourth conducting surfaces, without travelling through the first and second conducted surfaces, to generate an RF magnetic field in the second direction, and current travels through each of the first, second, third and fourth conducting surfaces, to generate an RF magnetic field in the third direction.

27. A probe as in claim 25, wherein a current travels through the first conducting surface and thereafter through the second conducting surface, without travelling through the third and fourth conducted surfaces, to generate an RF magnetic field in the first direction, a current travels through the third conducting surface and thereafter through the fourth conducting surface, without travelling through the first and second conducted surfaces, to generate an RF magnetic field in the second direction, and a current travels sequentially through each of the first, second, third and fourth conducting surfaces, to generate an RF magnetic field in the third direction.

28. A probe as in claim 25, wherein current travels through the first, second, third and fourth conducting surfaces to generate an RF magnetic field in an arbitrary direction.

29. A probe as in claim 11, further comprising:

twelve elements connected together to form a cube, each element being an edge of the cube and formed of a capacitor and an inductor connected in series, wherein the elements are provided with current which is controllable to cause the probe to generate the RF magnetic field in the first direction and the RF magnetic field in the second direction.

30. A probe as in claim 12, further comprising:

twelve elements connected together to form a cube, each element being an edge of the cube and formed of a capacitor and an inductor connected in series, wherein the elements are provided with current which is controllable to cause the probe to generate the RF magnetic field in the first direction, the RF magnetic field in the second direction and the RF magnetic field in the third direction.

31. A probe as in claim 18, further comprising:

twelve elements connected together to form a cube, each element being an edge of the cube and formed of a capacitor and an inductor connected in series, wherein the elements are provided with current which is controllable to cause the probe to generate the RF magnetic field in the first direction and the RF magnetic field in the second direction.

32. A probe which generates an RF magnetic field along an RF magnetic field axis towards a sample to cause a resonance signal in the sample, the resonance signal including nuclear quadrupole resonance (NQR) and acoustic ringing, wherein the probe detects the resonance signal along the RF magnetic field axis and detects the acoustic ringing along a direction not parallel to the RF magnetic field axis, so that the NQR in the resonance signal can be distinguished from the acoustic ringing in the resonance signal.

33. A probe as in claim 32, wherein the direction not parallel to the RF magnetic field axis is orthogonal to the RF magnetic field axis.

* * * * *